United States Patent
Grahek et al.

(10) Patent No.: US 12,260,931 B2
(45) Date of Patent: Mar. 25, 2025

(54) EXTENDED ADDRESS INTERFACE ACTIVATE SEQUENCE USING MODE REGISTER WRITE

(71) Applicant: Micron Technology, Inc., Boise, ID (US)

(72) Inventors: Paul Philip Grahek, Boise, ID (US); Jacob Walter Rice, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 257 days.

(21) Appl. No.: 17/965,592

(22) Filed: Oct. 13, 2022

(65) Prior Publication Data

US 2024/0127872 A1    Apr. 18, 2024

(51) Int. Cl.
*G11C 7/10*    (2006.01)

(52) U.S. Cl.
CPC .......... *G11C 7/1093* (2013.01); *G11C 7/1045* (2013.01); *G11C 7/1096* (2013.01)

(58) Field of Classification Search
CPC ... G11C 7/1093; G11C 7/1045; G11C 7/1096; G11C 7/22; G11C 8/12; G11C 11/4087; G11C 7/109; G11C 11/4076
USPC ....................................... 365/233.1
See application file for complete search history.

(56) References Cited

U.S. PATENT DOCUMENTS 10,424,367 B2    9/2019    Matsuno et al.
11,139,008 B2 *  10/2021   Penney ................ G11C 7/1087

OTHER PUBLICATIONS

U.S. Appl. No. 17/556,619, filed Dec. 20, 2021, Cho.

* cited by examiner

*Primary Examiner* — Huan Hoang
(74) *Attorney, Agent, or Firm* — Fletcher Yoder, P.C.

(57) ABSTRACT

A method and a device is provided for implementing a mode register to transmit additional activate information to a memory device. Additional activate information may be transmitted to the memory device without increasing the tRCD time, or increasing the command/address (CA) bus pins, or adding additional circuit area, thereby reducing the impact on the performance of the memory device.

18 Claims, 8 Drawing Sheets

| COMMAND | MODE (BG/16B) | SDR CMD PIN | COMMAND BUS / DDR COMMAND PLUS | | | | | | | CK_t EDGE |
|---|---|---|---|---|---|---|---|---|---|---|
| | | CS | CMD0 CA0 | CMD1 CA1 | CMD2 CA2 | CMD3 CA3 | CMD4 CA4 | CMD5 CA5 | CMD6 CA6 | |
| ACT-1 (ACTIVATE-1) | ANY | H | H | H | H | R14 | R15 | R16 | R17 | R1 |
| | BG | X | BA0 | BA1 | BG0 | BG1 | R11 | R12 | R13 | F1 |
| | 16B | | BA0 | BA1 | BA2 | BA3 | R8 | R9 | R10 | R1 |
| ACT-2 (ACTIVATE-2) | ANY | H | H | H | L | R7 | R4 | R5 | R6 | F1 |
| | | X | R0 | R1 | R2 | R3 | | | | |

FIG. 3

| COMMAND | CS | CA0 | CA1 | CA2 | CA3 | CA4 | CA5 | CA6 | CK_t EDGE |
|---|---|---|---|---|---|---|---|---|---|
| MRW-1 | H | L | L | L | H | H | L | H | R1 |
|  | X | MA0 | MA1 | MA2 | MA3 | MA4 | MA5 | MA6 | F1 |
| MRW-2 | H | L | L | L | H | H | L | OP7 | R1 |
|  | X | OP0 | OP1 | OP2 | OP3 | OP4 | OP5 | OP6 | F1 |
| TMRW-1 | H | L | L | L | H | H | L | H | R1 |
|  | X | TMA0 | TMA1 | TMA2 | TMA3 | TMA4 | TMA5 | TMA6 | F1 |
| TMRW-2 | H | L | L | L | H | H | L | H | R1 |
|  | X | TMOP0 | TOP1 | TMOP2 | TMOP3 | TMOP4 | TMA7 | TMA8 | F1 |

| tmAmrCtrl | ASYNC PIN | EXTERNAL COMMAND | INTERNAL FUNCTION |
|---|---|---|---|
| 0 | X | TMRW-2 | TMRW-2 |
| 1 | 0 | TMRW-2 | TMRW-2 |
| 1 | 1 | TMRW-2 | MRW-2(AMR) |

EXTENDED ADDRESS INTERFACE ACTIVATE SEQUENCE USING MODE REGISTER WRITE

BACKGROUND OF THE INVENTION

Field of the Invention

The present invention relates generally to the field of memory devices. More specifically, embodiments of the present disclosure relate to providing memory commands for accessing, sensing, and other operations for memory cells.

Description of the Related Art

Memory devices are widely used to store information related to various electronic devices such as computers, wireless communication devices, cameras, digital displays, and the like. Memory devices are frequently provided as internal memory, integrated circuits and/or external removable devices in computers or other electronic devices. There are many different types of memory, including volatile and non-volatile memory. Volatile memory, including random-access memory (RAM), static random access memory (SRAM), dynamic random access memory (DRAM), and synchronous dynamic random access memory (SDRAM), among others, may require a source of applied power to maintain its data. Non-volatile memory, by contrast, may retain its stored data even when not externally powered. Non-volatile memory is available in a wide variety of technologies, including flash memory (e.g., NAND and NOR) phase change memory (PCM), ferroelectric random access memory (FeRAM), resistive random access memory (RRAM), and magnetic random access memory (MRAM), among others.

A memory device may include a number of storage elements, such as memory cells. Memory cells of a binary memory device may, for example, include a charged or discharged capacitor. A charged capacitor of a memory cell may, however, become discharged over time through leakage currents, resulting in the loss of the stored information. Certain features of volatile memory may offer performance advantages, such as faster read or write speeds, while features of non-volatile memory, such as the ability to store data without periodic refreshing, may be advantageous. Some of the memory devices include memory cells that may be accessed by turning on a transistor that couples the memory cell (e.g., the capacitor) with a wordline or a bitline/digit line. Different memory devices may use different architectures for arranging the memory cells. For example, different memory devices may arrange the memory cells in 2-dimensional or 3-dimensional rows and columns. A memory cell may be accessed based on activating a row and a column of the memory device corresponding to the memory cell.

Improving memory devices, generally, may include increasing memory cell density, increasing read/write speeds or otherwise reducing operational latency, increasing reliability, increasing data retention, reducing power consumption, or reducing manufacturing costs, among other metrics. Emerging memory technologies may require greater activation power. To reduce power associated with activation, page sizes may be decreased, which may result in greater row address terms and less column terms. Further, increased density may require more row address terms. Moreover, to provide flexibility to controllers in memory devices, a dynamic page size activation feature may be provided allowing multiple page sizes (e.g., 256B or 512B) to be activated, which may require extra activate information. Additional row address and dynamic page size information may be transmitted with the activate (ACT) command, but the available DRAM ACT command address tables (e.g., generated for 7-pin command/address interface described by the LPDDR5 specification) may not accommodate transmission of the additional activate information. Additional command/address (CA) bus pins may be used to transmit additional activate information to the memory device, however, the physical compatibility may be reduced. The number of clock cycles that constitute an ACT command may also be increased to transmit additional activate information to the memory device, however, the system performance may be reduced. Further the transmission of additional activate information on a subsequent column command may require additional circuit area and heavily modified specifications. Accordingly, it is desirable to allow additional activate information to be transmitted to the memory device without requiring additional command/address (CA) bus pins, increasing activate cycle count, or impacting die size.

BRIEF DESCRIPTION OF THE DRAWINGS

Various aspects of this disclosure may better be understood upon reading the following detailed description and upon reference to the drawings in which:

FIG. 3 is a truth table for activate commands for a memory device, according to an embodiment of the present disclosure;

FIG. 4 is a truth table for mode register commands for a memory device, according to an embodiment of the present disclosure;

FIG. 7 illustrates a truth table for controlling the mode register commands, according to an embodiment of the present disclosure.

DETAILED DESCRIPTION OF SPECIFIC EMBODIMENTS

Figure 1:
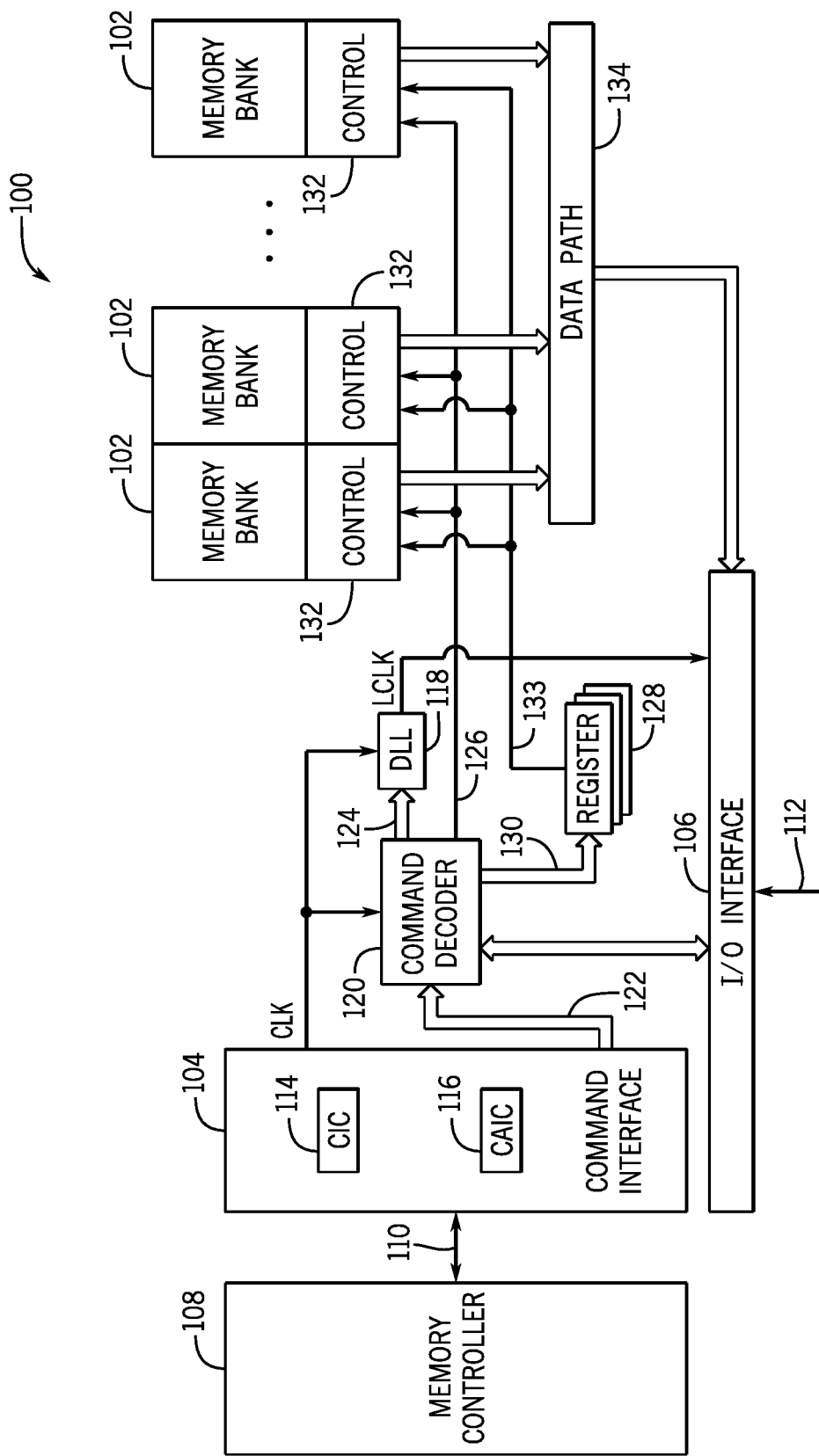
FIG. 1 is a block diagram illustrating certain features of a memory device, according to an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

A memory device may perform memory operations such as storing data and retrieving stored data. For example, a computing system may include various system components including one or multiple memory devices. The system components may communicate data (e.g., data bits) to perform system operations. For example, the system may include one or more processing components, one or more memory devices, among other system components. In different embodiments, the computing system may be disposed on a single electronic chip or multiple electronic chips. Moreover, the computing system may be disposed on a single electronic device or multiple electronic devices positioned in proximity of or remote from each other.

In any case, the memory device may include multiple memory components for storing data and retrieving stored data based on receiving access commands (e.g., memory access requests) from various system components (e.g., a processor). For example, the processor may transmit the access commands using a number of data bits. In different embodiments, the processor may transmit the access commands using different communication protocols (e.g., memory command protocols under JEDEC standard). For example, the processor may use a memory command protocol based on a number of communication pins (hereinafter, pins) of the memory device. The memory device may receive a number of data bits corresponding to a number of pins of the memory device at each rising or falling edge of a clock signal.

The memory device may include a number of memory banks, controller circuitry, command decoder circuitry, and a clock circuit to provide the clock signal, among other memory components. In some cases, the controller circuitry (hereinafter, controller) may include the command decoder circuitry (hereinafter, command decoder). In alternative or additional cases, the command decoder may include separate circuitry disposed between the controller and the memory banks or any other viable location. Moreover, the memory components may include an input/output interface for communication with other system components. For example, the input/output interface of some memory components may include the pins for receiving the access commands from the processor.

In different embodiments, the memory device may include a different number of memory banks (e.g., 2 memory banks, 4 memory banks, 8 memory banks, etc.). Each memory bank may include a number of memory cells arranged in rows and columns. Moreover, in different cases, a memory bank may include a different number of rows and/or columns of the memory cells (e.g., 18 rows, 22 rows, 26 rows, etc.).

In any case, the command decoder may include circuitry to receive the access commands and provide the access instructions to the memory banks, as will be appreciated. The command decoder may facilitate accessing target memory cells by providing the access instructions. The access commands may include requests to perform memory operations including memory read operations and memory write operations on the target memory cells. In some cases, the processor of the computing system may transmit the access commands to the memory device. In different cases, any other viable processing circuitry may transmit the access commands to the memory device.

As mentioned above, the processor may transmit the access commands to the memory device using a memory command protocol. Moreover, the memory command protocol is determined, at least in part, based on a number of pins of the memory device. For example, at each rising or falling edge of the clock signal, the command decoder may receive a number of data bits of the access commands corresponding to the number of pins. Subsequently, the command decoder may provide the access instructions to activate respective rows and columns of the target memory cells for accessing (e.g., reading from and/or writing to) the target memory cells.

With the foregoing in mind, in different embodiments, the access commands may include a different length or include a different number of data bits. In some cases, each access command may include a header followed by a number of address bits associated with the target memory cells. For example, the header may have a unique combination of logic values for identifying a command type, e.g., an "ACT" command for transmitting activate information of a target memory cell, a "READ" command for a read operation of data from a target memory cell, or a "WRITE" command for a write operation of data to a target memory cell. Moreover, the address bits may include address information of the target memory cells indicating the rows, columns, and/or memory banks of the target memory cells.

In some embodiment, the memory device may access a set of target memory cells in one memory cycle, which may correspond to one or multiple clock cycles. In the one memory cycle, the memory device may receive a set of address bits indicative of the set of target memory cells. In different embodiments, the memory device may receive the set of address bits using one or multiple access commands, as will be appreciated. The set of address bits may include a number of data bits corresponding to a number of rows, columns, and/or memory banks of the memory cells in the memory device. For example, in one memory cycle, the set of address bits may include one address bit per row of memory cells of the memory device for indicating the set of target memory cells.

In some embodiments, a memory cycle may include multiple access commands, each including a respective command header and a portion of the set of address bits, to indicate the address information of the target memory cells. Each access command in the memory cycle may include a portion of the set of address bits for accessing the target memory cells. In some embodiments, the memory device may receive each access command using a single clock cycle. For example, each clock cycle may correspond to a rising edge and/or a falling edge of the clock signal. In alternative or additional embodiments, the processor may transmit the access commands using a multi-clock cycle memory command protocol. In such embodiments, the processor may transmit an access command including the set of address bits using multiple clock cycles. For example, the processor may provide the header and a portion of the set of address bits in a first clock cycle, then a remaining portion of the set of address bits may be provided in a second clock cycle. In some cases, the access command may provide the remaining portion of the set of address bits using multiple clock cycles (e.g., second clock cycle, third clock cycle, fourth clock cycle, etc.). In such embodiments, the processor may provide one header followed by a number of address bits using multiple clock cycles. The command decoder of the memory device may decode each access command after receiving it. The command decoder may provide the access instructions to the memory banks based on the received access commands.

As mentioned above, the number of address bits may correspond to the number of rows, columns, and/or memory banks of the memory device. In some cases, each address bit may correspond to a respective row and/or memory bank of the memory device. The number of pins of the memory device may correspond to a number of data bits the command decoder of the memory device may receive in each clock cycle. As discussed above, increasing memory cell density and/or reducing page size may require more row address terms. Moreover, to provide flexibility to controllers in memory devices, a dynamic page size activation feature may be provided allowing multiple page sizes (e.g., 256B or 512B) to be activated, which may require extra activate information. Additional row address and dynamic page size information should be transmitted with the activate (ACT) command, and the available DRAM ACT command address tables (e.g., generated for 7-pin command/address interface described by the LPDDR5 specification) do not accommodate enough information without implementing solutions that may greatly impact the performance of the memory devices, such as increasing the command/address (CA) bus pins, or increasing the number of clock cycles that constitute an ACT command, or adding additional circuit area. Accordingly, it is desirable to allow additional activate information to be transmitted to the memory device with reduced or negligible impact on the performance of the memory device.

The current disclosure herein provides a technology and methods related to utilizing mode registers to transmit additional activate information to a memory device. Additional activate information may be transmitted to the memory device without increasing the tRCD (i.e., minimum number of clock cycles required to issue a READ or WRITE command after the ACT command) time, or increasing the command/address (CA) bus pins, or adding additional circuit area, thereby reducing the impact on the performance of the memory device.

Turning now to the figures, FIG. 1 depicts a simplified block diagram illustrating certain features of a memory device 100 (e.g., a memory subsystem of an apparatus). Specifically, the block diagram of FIG. 1 depicts a functional block diagram illustrating certain functionality of the memory device 100. In accordance with one embodiment, the memory device 100 may include a random access memory (RAM) device, a ferroelectric RAM (FeRAM) device, a dynamic RAM (DRAM) device, a static RAM (SRAM) device (including a double data rate SRAM device), flash memory, and/or a 3D memory array including phase change (PC) memory and/or other chalcogenide-based memory, such as self-selecting memories (SSM). Moreover, each memory cell of such 3D memory array may include a corresponding logic storing device (e.g., a capacitor, a resistor, or the resistance of the chalcogenide material(s)).

The memory device 100 may include a number of memory banks 102 each including one or more memory arrays. Various configurations, organizations, and sizes of the memory banks 102 on the memory device 100 may be used based on an application and/or design of the memory device 100 within an electrical system. For example, in different embodiments, the memory banks 102 may include a different number of rows and/or columns of memory cells. Moreover, the memory banks 102 may each include a number of pins for communicating with other blocks of the memory device 100. For example, each memory bank 102 may receive one data bit per pin at each clock cycle. Furthermore, the memory banks 102 may be grouped into multiple memory groups (e.g., two memory groups, three memory groups).

The memory device 100 may also include a command interface 104 and an input/output (I/O) interface 106. The command interface 104 is configured to provide a number of signals received from a processor (e.g., a processor subsystem of an apparatus) or a controller, such as a memory controller 108. In different embodiments, the memory controller 108, hereinafter controller 108, may include one or more processors (e.g., memory processors), one or more programmable logic fabrics, or any other suitable processing components.

In some embodiments, a bus 110 may provide a signal path or a group of signal paths to allow bidirectional communication between the controller 108, the command interface 104 and the I/O interface 106. For example, the controller 108 may receive memory access requests from the I/O interface via the command interface 104 and the bus 110. Moreover, the controller 108 may provide the access commands and/or access instructions for performing memory operations to the command interface 104 via the bus 110.

Similarly, an external bus 112 may provide another signal path or group of signal paths to allow for bidirectional transmission of signals, such as data signals and access commands (e.g., read/write requests), between the I/O interface 106, the controller 108, a command decoder 120, and/or other components. Thus, the controller 108 may provide various signals (e.g., the access commands, the access instructions, or other signals) to different components of the memory device 100 to facilitate the transmission and receipt of data to be written to or read from the memory banks 102.

That said, the command interface 104 may receive different signals from the controller 108. For example, a reset command may be used to reset the command interface 104, status registers, state machines and the like, during power-up. Various testing signals may also be provided to the memory device 100. For example, the controller 108 may use such testing signals to test connectivity of different components of the memory device 100. In some embodiments, the command interface 104 may also provide an alert signal to the controller 108 upon detection of an error in the memory device 100. Moreover, the I/O interface 106 may additionally or alternatively be used for providing such alert signals, for example, to other system components electrically connected to the memory device 100.

The command interface 104 may also receive one or more clock signals from an external device (e.g., an external clock signal). Moreover, the command interface 104 may include a clock input circuit 114 (CIC) and a command address input circuit 116 (CAIC). The command interface 104 may use the clock input circuit 114 and the command address input circuit 116 to receive the input signals, including the access commands, to facilitate communication with the memory banks 102 and other components of the memory device 100.

Moreover, the clock input circuit 114 may receive the one or more clock signals (e.g., the external clock signal) and may generate an internal clock signal (CLK) therefrom. In some embodiments, the command interface 104 may provide the CLK to the command decoder 120 and an internal clock generator, such as a delay locked loop (DLL) 118 circuit. The DLL 118 may generate a phase controlled internal clock signal (LCLK) based on the received CLK. For example, the DLL 118 may provide the LCLK to the I/O interface 106. Subsequently, the I/O interface 106 may use the received LCLK as a clock signal for transmitting the read data using the external bus 112.

The command interface 104 may also provide the internal clock signal CLK to various other memory components. As mentioned above, the command decoder 120 may receive the internal clock signal CLK. In some cases, the command decoder 120 may also receive the access commands via a bus 122 and/or through the I/O interface 106 received via the external bus 112. For example, the command decoder 120 may receive the access commands through the I/O interface 106 transmitted by one or more external devices. In some cases, a processor may transmit the access commands.

The command decoder 120 may decode the access commands and/or the memory access requests to provide corresponding access instructions for accessing target memory cells. For instance, the command decoder 120 may provide the access instructions to one or more control blocks 132 associated with the memory banks 102 via a bus path 126. In some cases, the command decoder 120 may provide the access instructions to the control blocks 132 in coordination with the DLL 118 over a bus 124. For example, the command decoder 120 may coordinate generation of the access instructions in-line (e.g., synchronized) with the CLK and/or LCLK. In some cases, the command decoder 120 may receive the access commands using a rising edge and/or a falling edge of the external clock signal. For example, a processor may transmit the access commands using a memory command protocol, such as a single clock cycle memory command protocol, or a multi-clock cycle memory command protocol. The processor may use a specific memory command protocol (as illustrated in FIG. 3) based at least in part on the number of pins of the memory device 100 or the I/O interface 106, the number of rows and/or columns of the memory banks 102, and the number of memory banks 102. Subsequently, the command decoder 120 may provide the access instructions to the memory banks 102 based on receiving and decoding the access commands.

Accordingly, the command decoder 120 may provide the access instructions to the memory banks 102 using one or multiple clock cycles of the CLK via the bus path 126. The command decoder 120 may also transmit various signals to one or more registers 128 via, for example, one or more global wiring lines 130. Moreover, the memory device 100 may include other decoders, such as row decoders and column decoders, to facilitate access to the memory banks 102, as discussed below.

In some embodiments, each memory bank 102 may include a respective control block 132. In some cases, each of the control blocks 132 may also provide row decoding and column decoding capability based on receiving the access instructions. Accordingly, the control block 132 may facilitate accessing the memory cells of the respective memory banks 102. For example, the control blocks 132 may include circuitry (e.g., logic circuitry) to facilitate accessing the memory cells of the respective memory banks 102 based on receiving the access instructions.

In some cases, the control blocks 132 may receive the access instructions and determine target memory banks 102 associated with the target memory cells. In specific cases, the command decoder 120 may include the control blocks 132. Moreover, the control blocks 132 may also provide timing control and data control functions to facilitate execution of different commands with respect to the respective memory banks 102.

Furthermore, the command decoder 120 may provide register commands to the one or more registers 128 to facilitate operations of one or more of the memory banks 102, the control blocks 132, and the like. For example, one of the one or more registers 128 may provide instructions to configure various modes of programmable operations and/or configurations of the memory device 100. The one or more registers 128 may be included in various memory devices to provide and/or define operations of various components of the memory device 100. The one or more registers 128 may communicate with the control blocks 132 via a bus path 133.

In some embodiments, the one or more registers 128 may provide configuration information to define operations of the memory device 100. For example, the one or more registers 128 may include operation instructions for DRAMs, synchronous DRAMs, FeRAMs, chalcogenide memories (e.g., SSM memory, PC memory), or other types of memories. As discussed above, the one or more registers 128 may receive various signals from the command decoder 120, or other components, via the one or more global wiring lines 130.

In some embodiments, the one or more global wiring lines 130 may include a common data path, a common address path, a common write command path, and a common read command path. The one or more global wiring lines 130 may traverse across the memory device 100, such that each of the one or more registers 128 may couple to the global wiring lines 130. The additional registers may involve additional wiring across the memory device (e.g., die), such that the registers are communicatively coupled to the corresponding memory components.

The I/O interface 106 may include a number of pins (e.g., 7 pins) to facilitate data communication with external components (e.g., the processing component, such as a processor). Particularly, the I/O interface 106 may receive the access commands via the pins. Moreover, data stored on the memory cells of the memory banks 102 may be transmitted to and/or retrieved from the memory banks 102 over the data path 134. The data path 134 may include a plurality of bi-directional data buses to one or more external devices via the I/O interface 106. For certain memory devices, such as a DDR5 SDRAM memory device, the I/O signals may be divided into upper and lower bytes; however, such segmentation is not utilized in conjunction with other memory device types.

That said, in different embodiments, the memory device 100 may include additional or alternative components. That is, the memory device 100 may include additional or alternative components such as power supply circuits (for receiving external VDD and VSS signals), read/write amplifiers (to amplify signals during read/write operations), temperature sensors (for sensing temperatures of the memory device 100), etc. Accordingly, it should be understood that the block diagram of FIG. 1 is only provided to highlight certain functional features of the memory device 100 to aid in the subsequent detailed description.

Figure 2:
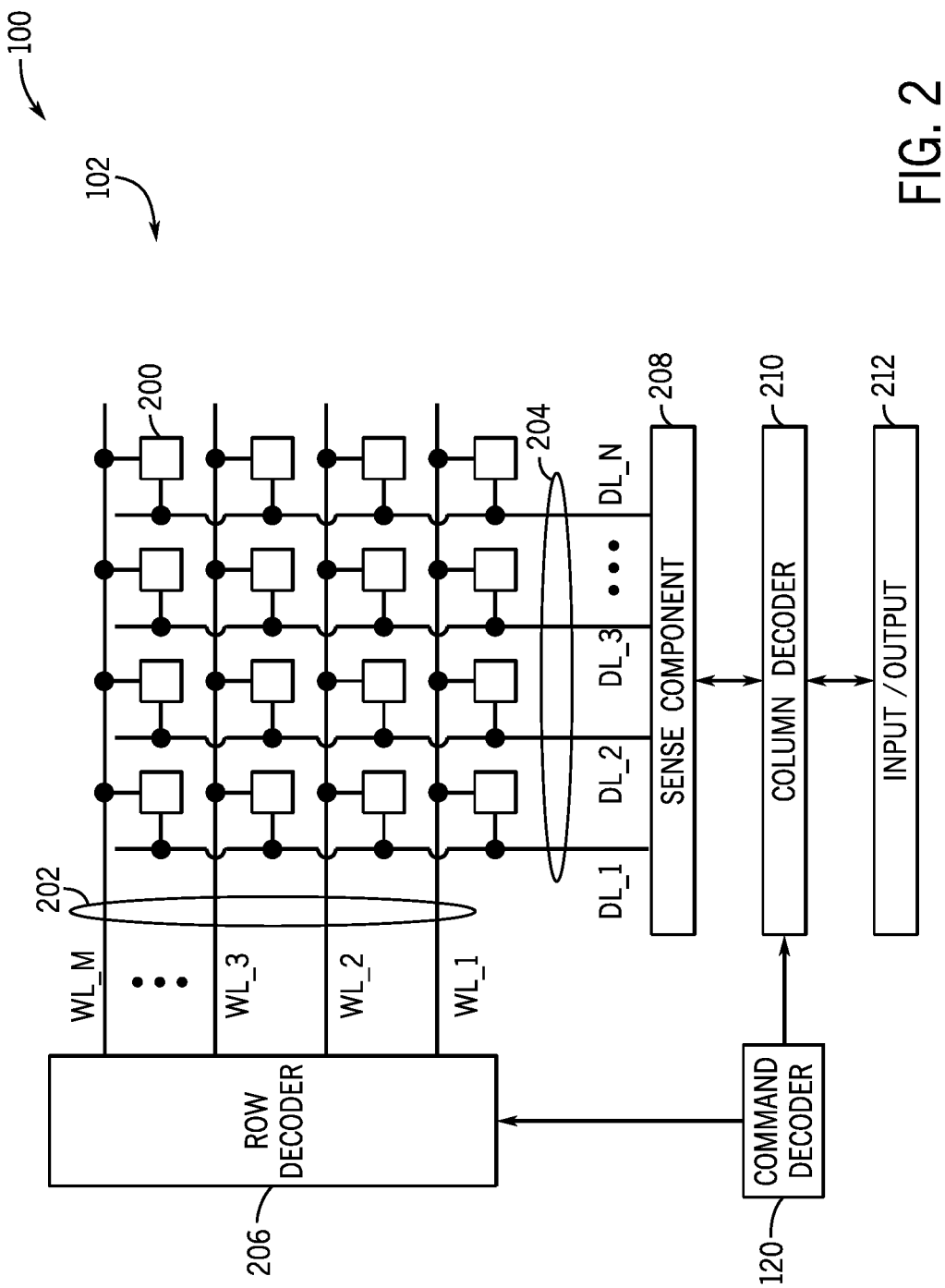
FIG. 2 is a memory bank of the memory device of FIG. 1, according to an embodiment of the present disclosure.

Referring now to FIG. 2, a memory bank 102 of the memory device 100 is illustrated in accordance with various examples of the present disclosure. The memory bank 102 may include a number of memory cells 200 that are programmable to store different memory states. In the depicted embodiment, the memory cells 200 may be arranged in multiple rows (e.g., 22 rows, 19 rows, etc.) and multiple columns.

Memory operations, such as reading and writing memory states, may be performed on the memory cells 200 by activating or selecting the appropriate word lines 202 and digit lines 204. Activating or selecting a word line 202 or a digit line 204 may include applying a voltage to the respective lines. The word lines 202 and the digit lines 204 may include conductive materials.

For example, word lines 202 and digit lines 204 may be made of metals (such as copper, aluminum, gold, tungsten, etc.), metal alloys, other conductive materials, or the like. In the depicted embodiment, each row of the memory cells 200 is connected to a single word line 202, and each column of the memory cells 200 is connected to a single digit line 204. Moreover, each of the memory cells 200 may be associated with a row and a column of the memory bank 102. Accordingly, each of the memory cells 200 is connected to a respective word line 202 and a respective digit line 204.

By applying a voltage to a single word line 202 and a single digit line 204, a single memory cell 200 may be activated (or accessed) at their intersection. Accessing the memory cell 200 may include performing reading or writing operation on the memory cell 200. For example, a read operation may include sensing a charge level from the memory cell 200. The intersection of a word line 202 and digit line 204 may be referred to as an address of a respective memory cell 200. Accordingly, the command decoder 120 may provide the access instructions, including the address bits, to indicate the word lines 202 and digit lines 204 corresponding to the target memory cells 200.

In some architectures, the memory state storage of the memory cell 200 (e.g., a capacitor) may be electrically isolated from the digit line by a selection component. The word line 202 may be connected to and may control the selection component. For example, the selection component may be a transistor and the word line 202 may be connected to the gate of the transistor. Activating the word line 202 may result in an electrical connection or closed circuit between the capacitor of the memory cell 200 and its corresponding digit line 204. The digit line 204 may then be activated to either read or write the memory cell 200.

Accordingly, accessing the memory cell 200 may be controlled through a respective row decoder 206 and a respective column decoder 210. As mentioned above, in different embodiments, the controller 108, the command decoder 120, and/or the control blocks 132 may include the row decoder 206 and/or the column decoder 210. In some examples, the row decoder 206 may receive a row address from the command decoder 120 and may activate the appropriate word line 202 based on the received row address.

Similarly, a column decoder 210 may receive a column address from the command decoder 120 and may activate the appropriate digit line 204. The command decoder 120 may provide the row address and the column address based on receiving and decoding the access commands and providing the access instructions. For example, the memory bank 102 may include multiple word lines 202, labeled WL_1 through WL_M, and multiple digit lines 204, labeled DL_1 through DL_N, where M and N depend on the array size. Thus, by activating a word line 202 and a digit line 204, e.g., WL_2 and DL_3, the memory cell 200 at their intersection may be accessed.

In any case, upon accessing, the memory cell 200 may be read, or sensed, by sense component 208 to determine the stored state of the memory cell 200. For example, after accessing the memory cell 200, a ferroelectric capacitor of the memory cell 200 may discharge a first charge (e.g., a dielectric charge) onto its corresponding digit line 204 in other examples, after accessing the memory cell 200, the ferroelectric capacitor of the memory cell 200 may discharge a second or third charge (e.g, a polarization charge) onto its corresponding digit line 204. Discharging the ferroelectric capacitor may be based on biasing, or applying a voltage, to the ferroelectric capacitor.

The discharging may induce a change in the voltage of the digit line which sense component 208 may compare to a reference voltage (not shown) in order to determine the stored state of the memory cell 200. For example, if the digit line 204 has a higher voltage than the reference voltage, then sense component 208 may determine that the stored state in the memory cell 200 is related to a first predefined memory state. In some cases, the first memory state may include a state 1, or may be another value—including other logic values associated with multi-level sensing that enables storing more than two values (e.g., 3 states per cell or 1.5 bits per cell). The sense component 208 may include various transistors or amplifiers in order to detect and amplify a difference in the signals which may be referred to as latching. The detected logic state of the memory cell 200 may then be output through column decoder 210 as output 212.

In some examples, detecting and amplifying a difference in the signals, may include latching a charge that is sensed in sense component 208. One example of this charge may include latching a dielectric charge associated with the memory cell 200. As an example, the sense component 208 may sense a dielectric charge associated with the memory cell 200. The sensed dielectric charge may be latched in a latch within the sense component 208 or a separate latch that is in electronic communication with the sense component 208.

Memory cells may be activated before corresponding operations (e.g., read or write) can be enabled. Accordingly, activate (ACT) commands are used for activating a memory bank and a row of the memory bank. FIG. 3 illustrate a truth table 300 of ACT commands ("ACT-1" and "ACT-2") for a memory device with 7 CA bus pins CA[6:0] (e.g., generated for 7-pin command/address interface described by the LPDDR5 specification). As mentioned above, the processor of the computing system may transmit the access commands to the memory device 100, additionally or alternatively, any other viable processing circuitry may transmit the access commands to the memory device 100. For instance, the command decoder 120 in the memory device 100 may receive the combinations of command signals including a chip select (CS) signal and command address signals CAj (j=0, 1, 2, 3, 4, 5, 6) for the ACT commands.

In the illustrated embodiment in FIG. 3, the "ACT-1" Command is followed by the ACT-2 command. In FIG. 3, "R1" and "F1" in a CK_t Edge field correspond to a rising edge and a falling edge of a single clock cycle of each ACT command (number "1" means only one clock cycle is used for each activate command), respectively. In the command truth table 300, a bit "X" represents a "Don't Care" signal, and the chip select signal (CS) represented by "X" can be floated. In the command truth table 300, BA[3:0] represent bank addresses, BG[1:0] represent bank group addresses, and R[17:0] represent row addresses.

Generally, the CS signal is active (e.g., "H") in the first clock cycle of a command using multiple clock cycles. The active CS signal indicates that a current clock cycle is the first clock cycle of the command. Once the command decoder detects the active CS signal, the command decoder may also receive a portion of the command at the first clock cycle and clock cycles after the first clock cycle of the clock signal. In the illustrated embodiment in FIG. 3, only one clock cycle is used, and each ACT command has two portions corresponding to the rising edge (R1) and the falling edge (F1) of the single clock cycle, respectively. That is, in the illustrated embodiment, the CS signal is active (e.g., "H") in the first portion of each ACT command, which is at the rising edge of the single clock cycle (i.e., the CK_t Edge field corresponds to "R1"). In FIG. 3, since each ACT command has only two portions, the value of the CS signal for the second portion of each ACT command, which is at the falling edge of the single clock cycle (i.e., the CK_t Edge field corresponds to "F1"), can be any value (e.g. either "H" or "L") and thus is indicated by "X". In the illustrated embodiment in FIG. 3, the active CS signal indicates that the command decoder continues to receive the remaining portion after the first portion of the ACT command (e.g., the second portion) at the falling edge of the single clock signal. In this manner, the ACT command can be completely received by the memory device in one clock cycle.

In the illustrated embodiment in FIG. 3, the first portion of the ACT command may include a header (e.g., CA[2:0]) having a unique combination (command code) of logic values (e.g., "H", "L") for identifying a command type (e.g., "ACT-1", "ACT-2"). For example, the "ACT-1" command for activate a first portion of the memory banks and rows in the memory banks may include a command code having a combination of CA0 to CA2 as "HHH", the "ACT-2" command for activate a second portion of the memory banks and rows in the memory banks may include a command code having a combination of CA0 to CA2 as "HHL". In the illustrated embodiment in FIG. 3, there are 18 row address terms that reside on the "ACT-1" and "ACT-2" commands, accordingly, the number of pages that could be activated is associate with only 18 rows. For instance, in the illustrated embodiment in FIG. 3, the "ACT-1" command transmits row addresses R[17:14] using CA[6:3] in the first portion (at the rising edge of the single clock cycle) and row addresses R[13:11] using CA[6:4] in the second portion (at the falling edge of the single clock cycle). The "ACT-1" command transmits bank addresses BA[3:0] using CA[3:0] for mode 16B, or BA[1:0] using CA[1:0] and bank group addresses BG[1:0] using CA[3:2] for mode BG, in the second portion. The "ACT-2" command transmit row addresses R[10:7] using CA[6:3] in the first portion (at the rising edge of the single clock cycle) and row addresses R[6:0] using CA[6:0] in the second portion (at the falling edge of the single clock cycle). It should also be noted that, although a single clock cycle is used in the ACT commands in the embodiments illustrated in FIG. 3, multiple clock cycles (e.g., second clock cycle, third clock cycle, fourth clock cycle, etc.) may be used for the ACT commands in other embodiments.

Figure 5:
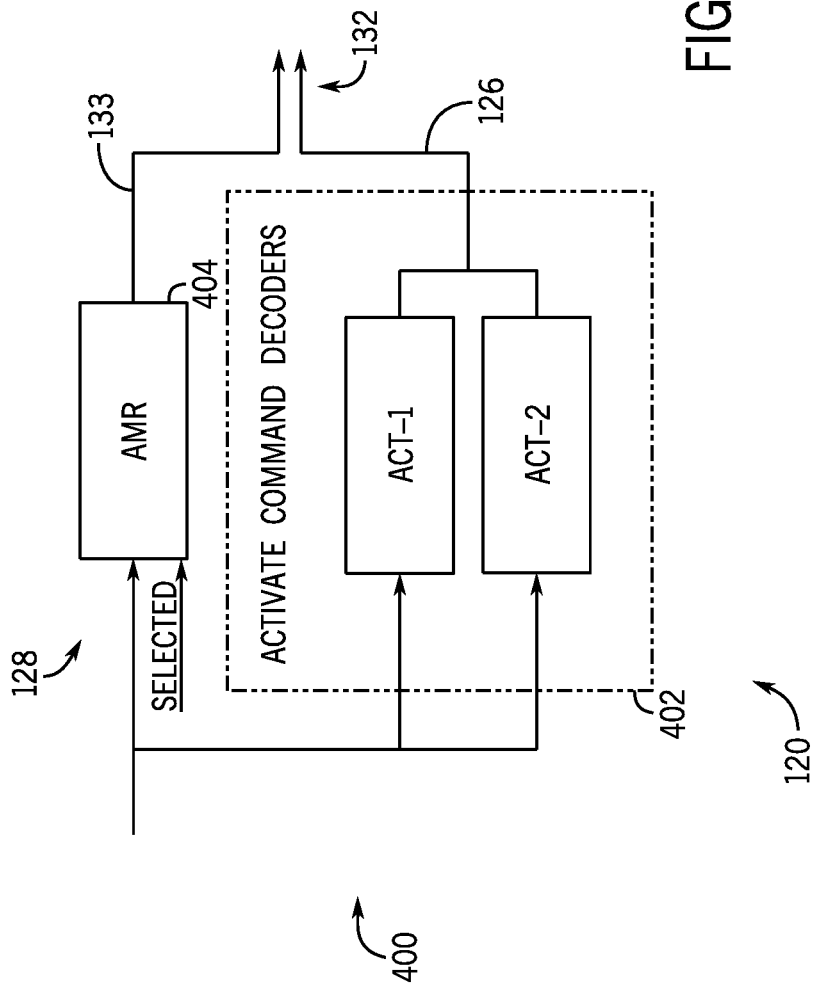
FIG. 5 illustrates a block diagram implementing a mode register to activate a memory bank, according to an embodiment of the present disclosure.

As mentioned above, to reduce power associated with activation, page sizes may be decreased, which may result in greater row address terms and less column terms. Further, increased density may require more row address terms. Moreover, to provide flexibility to the controller, a dynamic page size activation feature may be provided allowing multiple page sizes (e.g., 256B or 512B) to be activated, which may require extra activate information. Additional row address and dynamic page size information should be transmitted with the activate (ACT) commands. To avoid modifying the ACT commands (e.g., the CA bus pins or the number of clock cycles in each ACT command), the additional activate information may be transmitted using mode registers (MR). The additional activate information may be used by an ACT command to transmit additional activate information to the memory device. That is, one or more mode registers may be used to transmit additional activate information to the memory device, as illustrated in FIG. 4 and FIG. 5.

FIG. 4 illustrates a truth table 350 of mode register write commands (MRW) for a memory device with 7 CA bus pins CA[6:0] (e.g., generated for 7-pin command/address interface described by the LPDDR5 specification). As mentioned above, the processor of the computing system may transmit the access commands to the memory device 100, additionally or alternatively, any other viable processing circuitry may transmit the access commands to the memory device 100.

In the illustrated embodiment in FIG. 4, the mode register write command "MRW-1" is followed by the mode register write command MRW-2 command. Similar to FIG. 3, "R1" and "F1" in a CK_t Edge field in FIG. 4 correspond to a rising edge and a falling edge of a single clock cycle of each mode register write command MRW (number "1" means only one clock cycle is used for each activate command), respectively. MA[6:0] represent mode register addresses, OP[7:0] represent the opcodes to be written. TMRW commands are the mode register write commands under testmode, TMA[9:0] represent mode register addresses in the testmode, and TMOP[4:0] represent opcodes to be written in the testmode. That is, when the memory device 100 enters testmode entry, the MRW command is mapped to the corresponding TMRW command to enable loading testmodes (i.e., in testmode, TMRW commands are used). The testmode is discussed in detail in FIG. 7.

In the illustrated embodiment in FIG. 4, only one clock cycle is used, and each MRW command has two portions corresponding to the rising edge (R1) and the falling edge (F1) of the single clock cycle, respectively. That is, in the illustrated embodiment, the CS signal is active (e.g., "H") in the first portion of each MRW command, which is at the rising edge of the single clock cycle (i.e., the CK_t Edge field corresponds to "R1"). In the illustrated embodiment in FIG. 4, since each MRW command has only two portions, the value of the CS signal for the second portion of each mode register write command MRW, which is at the falling edge of the single clock cycle (i.e., the CK_t Edge field corresponds to "F1"), can be any value (e.g. either "H" or "L") and thus is indicated by "X". A bit "X" represents a "Don't Care" signal, which means a signal (e.g., the chip select signal (CS)) represented by "X" can be floated. In FIG. 4, the active CS signal indicates that the command decoder continues to receive the remaining portion after the first portion of the MRW command (e.g., the second portion) at the falling edge of the single clock signal. In this manner, the MRW command can be completely received by the memory device in one clock cycle.

In the illustrated embodiment in FIG. 4, the first portion of the MRW command may include a header having a unique combination (command code) of logic values (e.g., "H", "L") for identifying a command type (e.g., "MRW-1", "MRW-2"). For example, the mode register write command "MRW-1" may include a command code having a combination of CA0 to CA6 as "LLLHHLH", and the mode register write command "MRW-2" may include a command code having a combination of CA0 to CA5 as "LLLHHL". In the illustrated embodiment in FIG. 4, the total number of row addresses that could be transmitted by the mode register write commands "MRW-1" and "MRW-2" is 8. For instance, in the illustrated embodiment in FIG. 4, the mode register write command "MRW-1" may select a mode register to write the additional activate information by using MA[6:0] to transmit the corresponding selected mode register address. The mode register write command "MRW-2" may write totally 8 row addresses to the selected mode register using CA6 (e.g., opcode OP7) in the first portion (at the rising edge of the single clock cycle) and CA[6:0] (e.g., opcodes OP[6:0]) in the second portion (at the falling edge of the single clock cycle). The additional row address information may be used by an ACT command to activate additional rows (e.g., additional 8 row addresses) in the memory device. For example, in the illustrated embodiment in FIG. 3, there are 18 row address terms that reside on the ACT commands, and adding the additional 8 row addresses from the selected mode register, a total of 26 row addresses may be transmitted, and, accordingly, the number of pages that could be activated is associated with 26 row addresses.

It should be noted that, although one mode register is used in the illustrated embodiment above, more than one mode register may be used to transmit additional activate information. For example, additional mode register write commands MRW-1 may be used to select additional mode registers, and the corresponding additional mode register write commands MRW-2 may be used to transmit extra additional activate information (e.g., additional row addresses). It should also be noted that, although additional row addresses are written to the select mode register for activating additional rows in the illustrated embodiment above, other activate information (e.g., bank addresses, bank group addresses) may also be written to the select mode register for activation by the ACT commands. It should also be noted that, although a single clock cycle is used in the MRW commands in the embodiments illustrated in FIG. 4, multiple clock cycles (e.g., second clock cycle, third clock cycle, fourth clock cycle, etc.) may be used for the MRW commands in other embodiments.

FIG. 5 illustrates a block diagram 400 of an embodiment for ACT commands implementing additional activate information stored in a mode register (MR) to activate memory cells. As mentioned above, the command decoder 120 may decode the access commands and/or the memory access requests received to provide corresponding access instructions for accessing target memory cells. The command decoder 120 may include activate command decoders 402 for the ACT commands (e.g., "ACT-1", "ACT-2") to provide activate instructions to target memory cells. For instance, the activate command decoders 402 may provide the activate instructions to one or more control blocks 132 associated with the corresponding target memory banks 102 via the bus path 126. For example, the activate command decoders 402 may provide the activate information transmitted by the "ACT-1" and "ACT-2" commands to the control blocks 132 associated with the corresponding memory banks via the bus 126.

To transmit activate information for additional rows of memory cells (e.g., more than 18 rows of memory cells in the illustrated embodiment in FIG. 3), a mode register may be selected as an activate mode register (AMR) 404 to transmit the additional activate information (e.g., 8 additional row addresses in the illustrated embodiment in FIG. 4). As described above, the activate mode register (AMR) 404 may be selected by using the mode register write command "MRW-1", and the additional activate information (e.g., 8 additional row addresses) may be written to the AMR 404 by using the mode register write command "MRW-2". The additional activate information (e.g., additional 8 row addresses) may be output from the AMR 404 to the control blocks 132 associated with the corresponding memory banks via the bus path 133. Accordingly, the total activate information, including the activate information transmitted by the ACT commands (e.g., including the 18 row addresses transmitted by the "ACT-1" and "ACT-2") and the additional activate information transmitted by the AMR 404 (e.g., the additional 8 row addresses) may be transmitted to corresponding memory components (e.g., row decoder 206) in the corresponding control blocks 132. As mentioned above, the processor of the computing system may transmit the access commands (e.g., ACT commands, MRW commands) to the memory device 100, additionally or alternatively, any other viable processing circuitry may transmit the access commands to the memory device 100. It should be noted that, although one mode register is selected and used to transmit addition activate information in the illustrated embodiment above, more than one mode register may be used to transmit additional activate information.

The number of access commands, and thus the number of clock cycles, required to activate additional activate information by implementing the activate mode register AMR 404 may vary based on different situations. For example, four commands ("MRW-1", "MRW-2", "ACT-1", "ACT-2") may be needed for the initial set up of each activate mode register AMR 404 (e.g., after either power-up, power-down, or MRR (mode register read) command). In this case, each AMR 404 needs to be selected by a respective mode register write command "MRW-1" first, and the additional activate information may be written to the corresponding AMR 404 by using a respective mode register write command "MRW-2". Then the ACT commands ("ACT-1" and "ACT-2") may activate the additional activate information stored in the corresponding AMR 404. In some embodiments, the AMR 404 may be set up already, but the additional activate information (e.g., additional row address) stored in the AMR 404 may need to be updated (e.g., for different memory banks), in which case three commands ("MRW-2", "ACT-1", "ACT-2") may be needed since the AMR 404 is selected already. In this case, the mode register write command "MRW-1 is not needed and the updated additional activate information may be written to the corresponding AMR 404 by using a respective mode register write command "MRW-2". Then the ACT commands ("ACT-1" and "ACT-2") may activate the updated additional activate information stored in the corresponding AMR 404. In other embodiments, the AMR 404 may be set up already and the additional activate information stored in the AMR 404 may be valid to use (e.g., no update needed), in which case no mode register write command may be needed and the two activate commands ("ACT-1", "ACT-2") may implement the same additional activate information stored in the AMR 404 previously.

Figure 6:
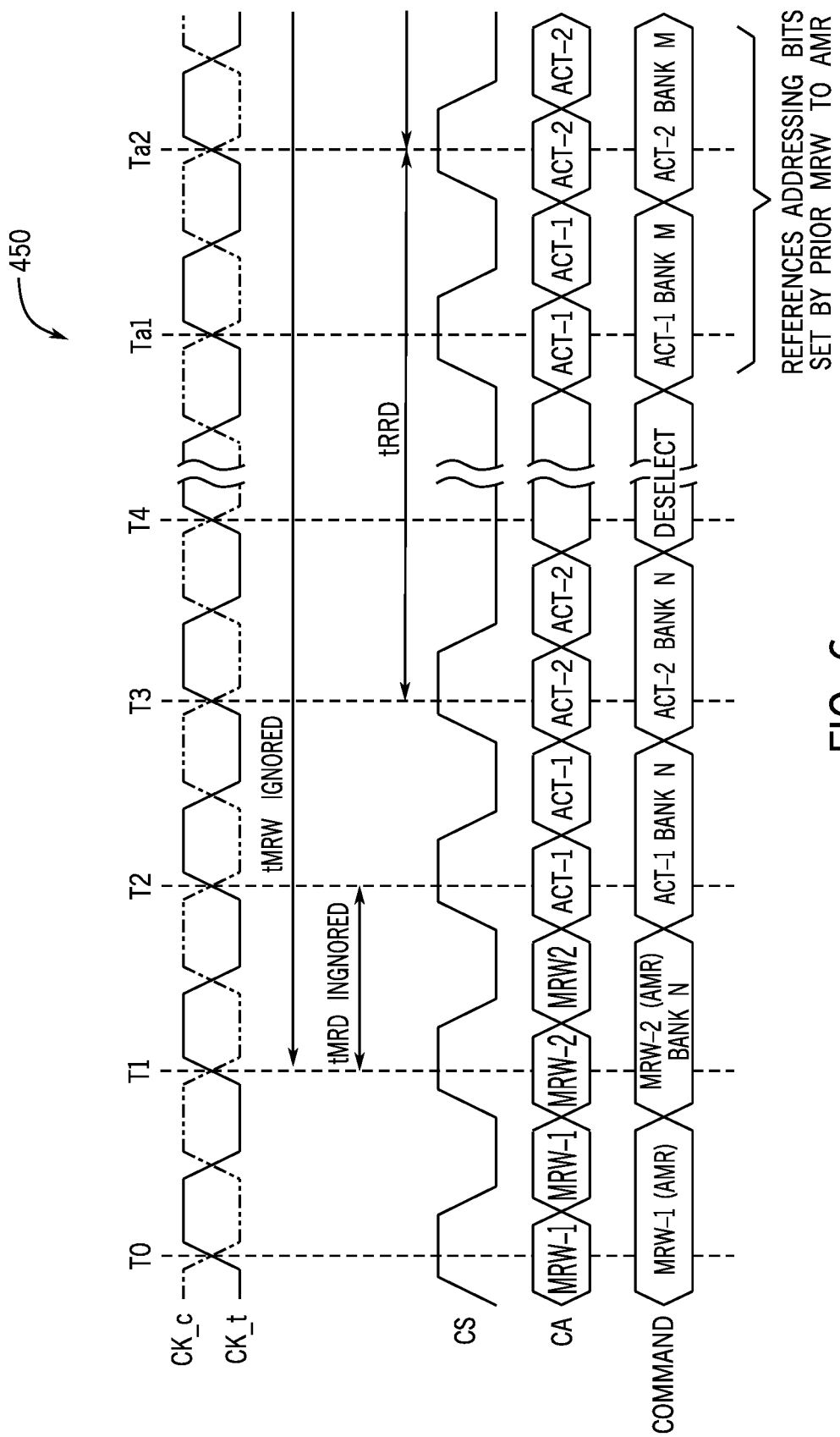
FIG. 6 illustrates a timing diagram implementing a mode register to activate a memory bank, according to an embodiment of the present disclosure.

FIG. 6 illustrates a timing diagram 450 of an embodiment implementing a mode register write command for transmitting additional activate information to activate a memory bank. Two clock signals are used in the timing diagram 450, a true clock signal (CK_t) and a complementary clock signal (CK_c). CK_t Edge used in the truth table 300 in FIG. 3 and the truth table 350 in FIG. 4 correspond to the true clock signal (CK_t). In FIG. 6, mode register write commands "MRW-1" and "MRW-2" may be used for the initial setup of an AMR 404 selected to transmit the additional activate information. For example, at time T0, a mode register write command "MRW-1" may select one of the one or more registers 128 to be the activate mode register AMR 404. At time T1, a mode register write command "MRW-2" may transmit the initial additional activate information regarding a memory bank N to the AMR 404 selected by the preceding mode register write command "MRW-1". The selected register AMR 404 may output the initial additional activate information to the control block 132 of the memory bank N. Then at time T2 and T3, the first initial activate commands "ACT-1" and "ACT-2" transmit activate information regarding the memory bank N, respectively. The activate to the memory bank N occurs by using the initial additional activate information transmitted by the mode register write command "MRW-2" to the AMR 404 at time T1, and the activate information transmitted by the initial activate commands "ACT-1" and "ACT-2" at time T2 and T3. Any activate command following the first initial activate commands, e.g., "ACT-1" and "ACT-2" to a memory bank M at time Ta1 and Ta2 in FIG. 6 (tRRD is the minimum amount of time between successive activate commands ACT to the same memory device), may implement the same additional activate information stored in the AMR 404 at time T1 to activate the memory bank M. Additional mode register write command MRW may not be needed in the illustrated embodiment if the additional activate information stored in the AMR 404 at time T1 is valid (e.g., no update needed) for all memory banks that need to be activated. In the situation that the additional activate information is different for different memory banks that need to be activated, additional mode register write command "MRW-2" may be used to write the updated additional activate information to the AMR 404. In the embodiment that more than one activate mode registers are used to transmit the additional activate information, additional mode register write command "MRW-1" may be used to select the more than one activate mode registers. It should also be noted that, although a single clock cycle is used in the MRW commands and the ACT commands in the embodiments illustrated in FIG. 6, multiple clock cycles (e.g., second clock cycle, third clock cycle, fourth clock cycle, etc.) may be used in other embodiments.

Accordingly, the illustrated embodiment above provides dynamic page size activation and, at the same time, maintains or increases system performance (e.g., maintains two cycle activate sequence "ACT-1" and "ACT-2" each with single clock cycle). Therefore, the present disclosure provides a cost efficient method and technology to provide a compatible interface to incorporate with the emerging memory devices. For example, the current disclosure allows existing memory devices with 7 pin CA interfaces to be used on future higher density parts with extended memory cell addresses (e.g., 9-pin CA memory devices with 26 row addresses), which adds more likelihood of market acceptance of emerging memory technology and, at the same time, utilizes already developed 7 pin CA support.

As mentioned above in FIG. 4, when the memory device 100 enters testmode entry, the MRW command is mapped to the corresponding TMRW command to enable loading testmodes (e.g., "MRW-1" is mapped to "TMRW-1", "MRW-2" is mapped to "TMRW-2"). This mapping in testmode entry prevents changing the additional activate information in the AMR 404 by using the mode register write command "MRW-2". This issue may be solved by exiting to normal operation with testmodes enabled. However, test time may be greatly impacted by this method because entering testmode entry from testmodes enabled may require a minimum command delay (e.g., max(2 clock cycles, 50 ns)), and exiting testmode entry to normal operation with testmodes enabled may also have a required minimum command delay (e.g., 8 multiplied by tMRD, where tMRD is of max(14 ns, 5 clock cycles)). Accordingly, it may take a minimum period of time (e.g., 162 ns) to exit and re-enter testmode entry to change the additional activate information in the AMR 404 in testmode entry. A testmode control, tmAmrCtrl, may be introduced with an async pin of the memory device 100 to indicate whether TMRW-2 will execute a normal testmode entry command or instead behave as an MRW-2 command when it is regarding the AMR 404. That is, based on the state of the tmAmrCtrl and the signal received at the async pin of the memory device 100, when the external command is a TMRW-2 command, the internal function may be a MRW-2 command related to the AMR 404.

FIG. 7 shows a truth table 480 for the internal function changes with the state of tmAmrCtrl and the async pin. For example, when the tmAmrCtrl is in state "0", and the async pin receives a signal with a bit "X" representing a "Don't Care" signal, which can be any value (e.g. either "H" or "L"), the external command and the internal function are both TMRW-2 command (i.e., TMRW-2 will execute a normal testmode entry command). When the tmAmrCtrl is in state "1", the async pin receives a signal having a bit "0" indicates that the external command and the internal function are both TMRW-2 command (i.e., TMRW-2 will execute a normal testmode entry command). When the tmAmrCtrl is in state "1", the async pin receives a signal having a bit "1" indicates that the internal function is the mode register command MRW-2 used to write the additional activate information to the AMR 404 although the external command is TMRW-2. Accordingly, the delay time to change the additional activate information in testmode entry may be reduced or avoided by using the async pin and the testmode control tmAmrCtrl to control the mapping of the mode register command MRW-2 under testmodes. The async pin may be the default async pin of the memory device 100, and it may also be any other pins available in the memory device 100. In some embodiment, a new pin may be installed for controlling the mapping between the TMRW-2 command and the MRW-2 command.

Figure 8:
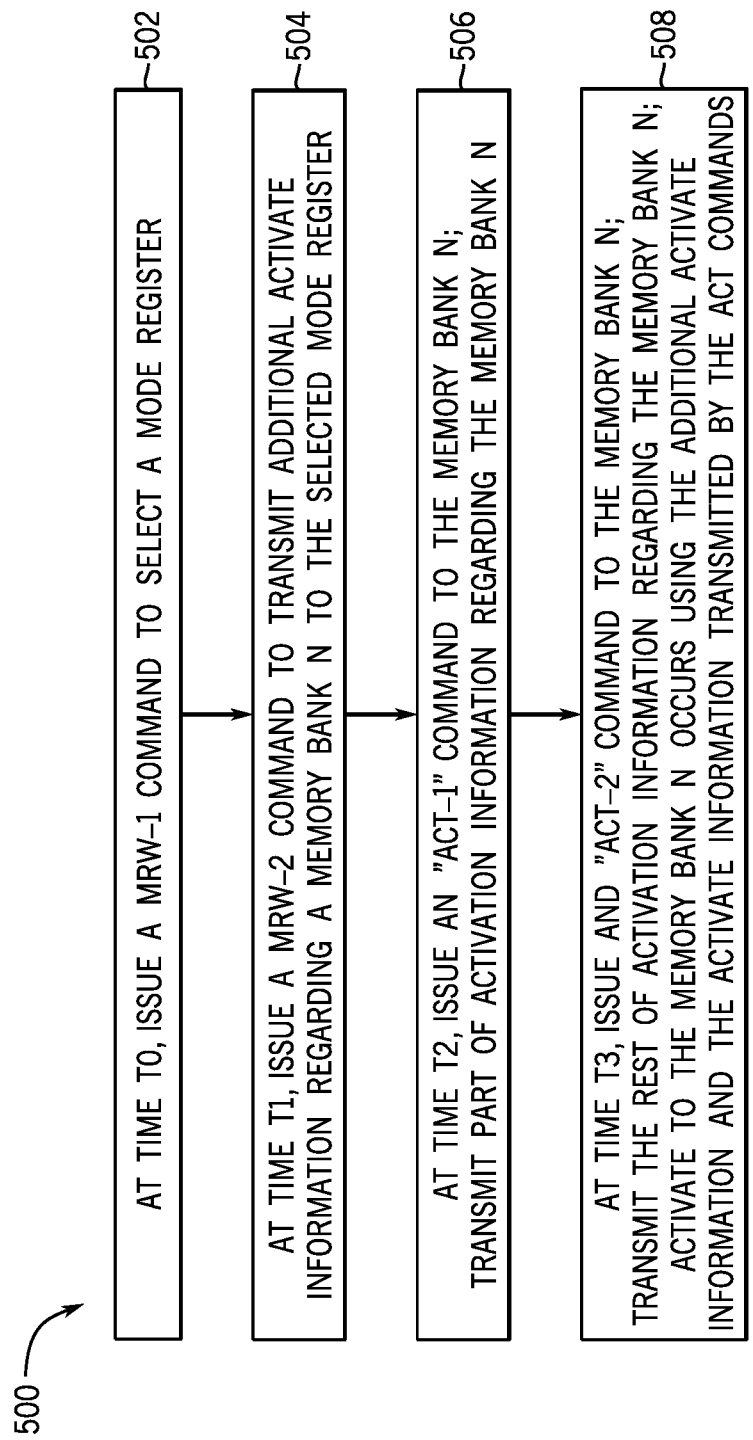
FIG. 8 illustrates a flow diagram of a method to transmit additional activate information, according to an embodiment of the present disclosure.

FIG. 8 illustrates a flow diagram of a method 500 for implementing a mode register to transmit additional activate information regarding a memory bank N. At block 502, a mode register write command "MRW-1" may select, at time T0, one of the one or more registers 128 to be the activate mode register AMR 404. At block 504, a mode register write command "MRW-2" may transmit, at time T1, the additional activate information regarding the memory bank N to the AMR 404 selected by the preceding mode register write command "MRW-1". The selected register AMR 404 may output the additional activate information to the control block 132 of the memory bank N.

At block 506, an activate command "ACT-1" to the memory bank N is issued at time T2 and transmits part of the activate information (e.g., R[17:11], BA[1:0], BG[1:0], as illustrated in the truth table 300 in FIG. 3) to the memory bank N. At block 508, an activate command "ACT-2" to the memory bank N is issued at time T3 and transmits the rest of the activate information (e.g., R[10:0] as illustrated in the truth table 300 in FIG. 3) to the memory bank N. That is the activate commands "ACT-1" and "ACT-2" transmit the activate information to the memory bank N. The activate to the memory bank N occurs at T3 by using the additional activate information transmitted by the mode register write command "MRW-2" to the AMR 404 at time T1, and the activate information transmitted by the initial activate commands "ACT-1" and "ACT-2" at time T2 and T3, respectively.

Accordingly, the technical effects of the present disclosure include a method and a system related to utilizing mode registers to transmit additional activate information to a memory device. Additional activate information may be transmitted to the memory device without increasing the tRCD (i.e., minimum number of clock cycles required to issue a READ or WRITE command after the ACT command) time, or increasing the command/address (CA) bus pins, or adding additional circuit area, thereby reducing the impact on the performance of the memory device.

In the illustrated embodiments above (e.g., FIG. 3 and FIG. 4), 7-pin CA interface is used to describe the access commands (e.g., "ACT-1", "ACT-2", "MRW-1", "MRW-2", etc.). However, it should be understood that the invention is not intended to be limited to the particular forms disclosed, e.g., other command interface with different number of CA pins may also be used (e.g., 9-pin CA interface), and/or the access commands (e.g., "ACT-1", "ACT-2", "MRW-1", "MRW-2", etc.) may have different specifications.

In the illustrated embodiments above, the memory devices and systems are primarily described in the context of devices incorporating DRAM storage media. Memory devices configured in accordance with other embodiments of the present technology, however, may include other types of memory devices and systems incorporating other types of storage media, including PCM, SRAM, FRAM, RRAM, MRAM, read only memory (ROM), erasable programmable ROM (EPROM), electrically erasable programmable ROM (EEROM), ferroelectric, magnetoresistive, and other storage media, including non-volatile, flash (e.g., NAND and/or NOR) storage media.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A device, comprising:
   a mode register selected from a plurality of mode registers by using a mode register write command, wherein the mode register is configured to:
      receive a command at a first clock cycle, wherein the command comprises a first portion of activate information regarding a first memory bank, wherein the first portion of the activate information is used by an activate command for activating the first memory bank at a second clock cycle, and wherein the activate command comprises a second portion of the activate information regarding the first memory bank; and
   processing circuitry configured to generate the command, wherein the processing circuitry is communicatively coupled to the mode register.

2. The device of claim 1, wherein the command comprises a mode register write command.

3. The device of claim 1, wherein the command is generated corresponding to a 7 pin command address bus interface.

4. The device of claim 1, wherein the first portion of the activate information comprises 8 row addresses.

5. The device of claim 1, wherein the second portion of the activate information comprises 18 row addresses.

6. The device of claim 1, wherein the first portion of the activate information is different from the second portion of the activate information.

7. The device of claim 1, wherein the first portion of the activate information regarding the first memory bank is used by a second activate command for activating a second memory bank at a third clock cycle.

8. A method comprising:
   receiving, by a mode register selected from a plurality of mode registers of a memory device by using a mode register write command, a command at a first clock cycle, wherein the command comprises a first portion of activate information regarding a first memory bank;
   receiving, by command decoder circuitry of the memory device, an activate command for activating the first memory bank at a second clock cycle, wherein the activate command comprises a second portion of the activate information regarding the first memory bank; and
   activating the first memory bank using the first portion and the second portion of the activate information regarding the first memory bank at the second clock cycle.

9. The method of claim 8, wherein the command comprises a mode register write command.

10. The method of claim 9, wherein the command is generated corresponding to a 7 pin command address bus interface.

11. The method of claim 8, wherein the first portion of the activate information comprises 8 row addresses.

12. The method of claim 8, wherein the second portion of the activate information comprises 18 row addresses.

13. The method of claim 8, wherein the first portion of the activate information is different from the second portion of the activate information.

14. The method of claim 8, wherein the first portion of the activate information regarding the first memory bank is used by a second activate command for activating a second memory bank at a third clock cycle.

15. A device, comprising:
   a mode register configured to:
      receive a first command at a first clock cycle, wherein the first command comprises a first portion of activate information regarding a first memory bank, wherein the first portion of the activate information is used by an activate command for activating the first memory bank at a second clock cycle, and wherein the activate command comprises a second portion of the activate information regarding the first memory bank; and
   a pin configured to receive a signal, wherein the first command is replaced with a second command based on the signal received by the pin.

16. The device of claim 15, wherein the first command comprises a mode register write command.

17. The device of claim 15, wherein the second command comprises a mode register write command under testmode.

18. The device of claim 15, wherein the first command is replaced with the second command further based on a value of a testmode control.

* * * * *